United States Patent [19]

Eidschun

[11] Patent Number: 4,457,515
[45] Date of Patent: Jul. 3, 1984

[54] BRUSH SEAL AND METHOD

[75] Inventor: Charles D. Eidschun, Clearwater, Fla.

[73] Assignee: Micro-Plate, Inc., Clearwater, Fla.

[21] Appl. No.: 287,268

[22] Filed: Jul. 27, 1981

[51] Int. Cl.³ .......................... E01G 5/16; B05D 3/12
[52] U.S. Cl. .......................................... 277/1; 277/53; 118/326; 118/DIG. 7; 405/147
[58] Field of Search .......................... 277/53, 1, 57, 80; 405/147; 118/326, DIG. 7

[56] References Cited

U.S. PATENT DOCUMENTS

| | | | |
|---|---|---|---|
| 3,031,802 | 5/1962 | Leliaert | 277/53 |
| 3,542,372 | 11/1970 | Edwardson | 277/1 |
| 3,917,150 | 11/1975 | Ferguson et al. | 277/53 |
| 3,979,920 | 9/1976 | Burgess et al. | 405/147 |
| 4,096,300 | 6/1978 | Williams | 118/326 |

Primary Examiner—Robert I. Smith
Attorney, Agent, or Firm—Jack E. Dominik

[57] ABSTRACT

Disclosed is a method and apparatus for positioning a pair of opposed brush assemblies in a gap defined by end baffles between process chambers. The brushes have a plurality of offset bristle clusters secured to a header, and the header is preferably angled so that the brushes will have a wiping action as a workpiece such as the printed circuit board passes between the bristles. A pair of brushes are employed with the opposed ends in overlapping relationship providing a wiping-type gate, and which permits the entrained fluid to drip down the bristle hairs and into the chamber from which the workpiece such as a printed circuit board is being removed. Optionally the brush bristles can be angled upwardly to incite a gravity assist for the entrained fluid dripping down toward the header of the brush and into the process tank.

16 Claims, 6 Drawing Figures

BRUSH SEAL AND METHOD

FIELD OF INVENTION

The present invention is directed to applications where products such as printed circuit boards are moved from station to station in a continuous process. More specifically, the invention relates to a brush seal which is positioned in a gap wherein the workpiece is transferred from one station to another.

SUMMARY OF THE PRIOR ART

Various types of seals and partitions are used in shielding members when they pass from one area to another. In my copending patent application entitled "Plating Cell with Continuous Cathode Contact and Method", a flexible polypropylene shield is employed. In another copending application Ser. No. 192,424, filed Sept. 29, 1980, roller-type seals are employed. Some such seals have reduced wiping and cleansing action, and will not effectively inhibit drag out through ventilation systems and into waste water systems.

SUMMARY

The present invention is directed to a method and apparatus for positioning a pair of opposed brush assemblies in a gap defined by end baffles between process chambers. The brushes have a plurality of offset bristle clusters secured to a header, and the header is preferably angled so that the brushes will have a wiping action as a workpiece such as the printed circuit board passes between the bristles. A pair of brushes are employed with the opposed ends in overlapping relationship providing a wiping-type gate, and which permits the entrained fluid to drip down the bristle hairs and into the chamber from which the workpiece such as a printed circuit board is being removed. Optionally the brush bristles can be angled upwardly to incite a gravity assist for the entrained fluid dripping down toward the header of the brush and into the process tank.

In view of the foregoing, it is a principal object of the present invention to provide an economical-type effective seal which serves as a mist eliminator for workpieces such as printed circuit boards which will effectively entrain the collection of spray and fluids on such a workpiece before passing into another process chamber and at the same time seal the ends of the chambers.

A further object of the present invention is directed to separating chambers in which dissimilar sprays may be employed so that there will be a minimized cross migration of one type of fluid from one chamber into the adjacent chamber which utilizes a different fluid.

A further object of the present invention is to provide an economical and effective method of reducing overspray and maximizing particle entrainment which is economical to install, and substantially trouble-free in operation.

THE ILLUSTRATIVE DRAWINGS

Further objects and advantages of the present invention will become apparent as the following description of an illustrative embodiment proceeds, taken in conjunction with the accompanying drawings, in which.

DESCRIPTION OF PREFERRED EMBODIMENT

Figure 1:
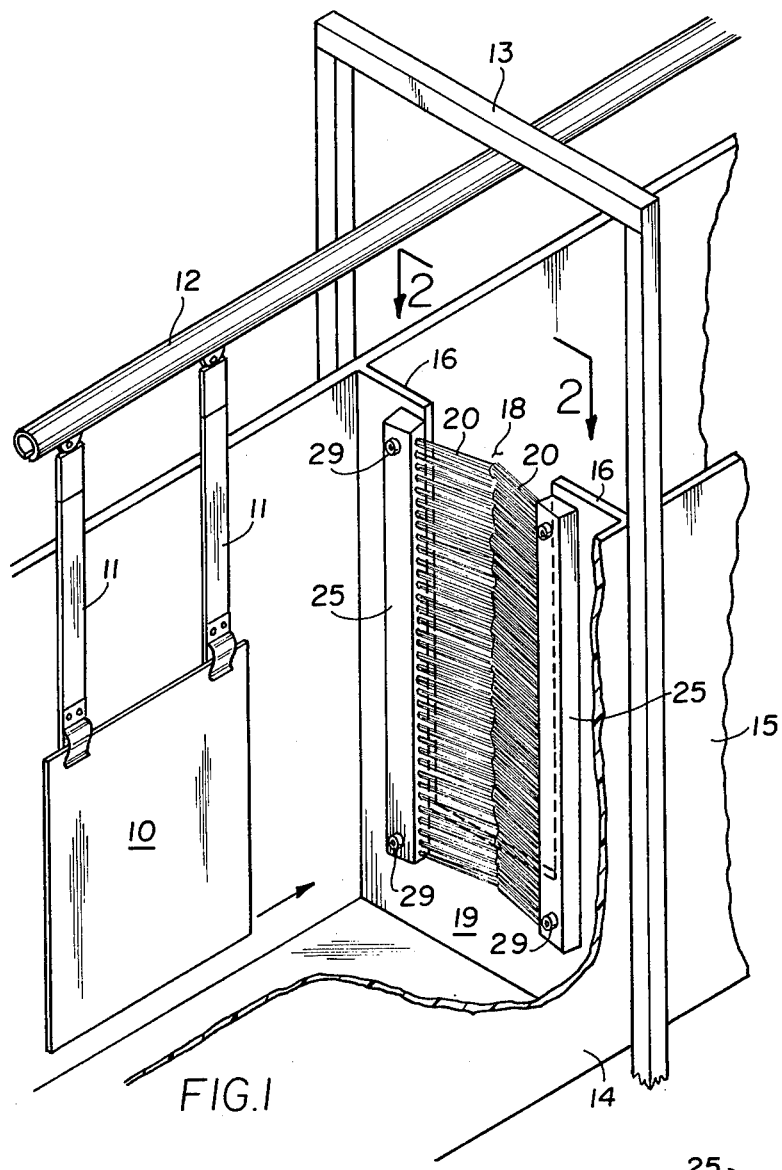
FIG. 1 is a broken partially diagrammatic view of a pair of adjacent processing chambers illustrating the installation of a pair of opposed brush assemblies in the gap defined between the two chambers.

As shown primarily in FIG. 1, the subject apparatus finds its utility, for example, in the processing of printed circuit boards 10 which are secured by means of workholders 11 to a continuous conveyor 12. A frame 13 supports a first process chamber 14 and a second process chamber 15. Between the two chambers 14, 15, a pair of opposed baffles 16 are provided defining a gap 18 therebetween. The baffles 16 terminate in a lower baffle base 19, the upper portion of which defines the lower portion of the gap 18.

Figure 2:
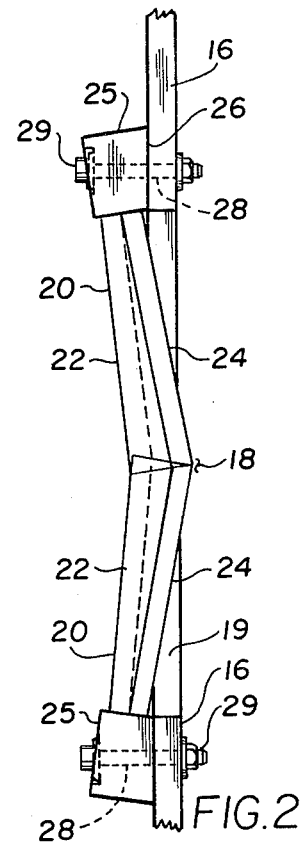
FIG. 2 is a top view of the brush assembly taken generally along section 2—2 of FIG. 1.
Figure 3:
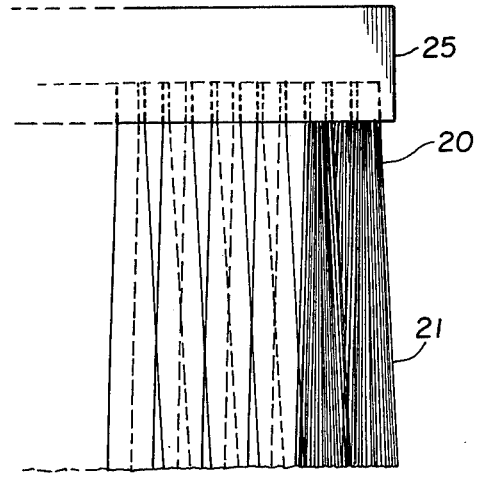
FIG. 3 is a front elevation of a brush taken at one end showing the overlapping relationship between the bristle clusters.
Figure 4:
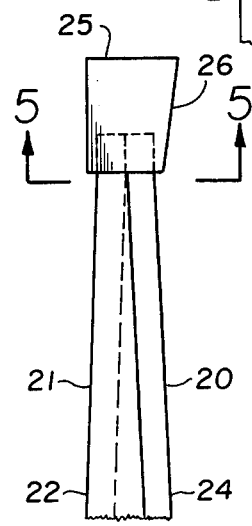
FIG. 4 is an end view of the brush assembly shown in FIG. 3.

As noted, a pair of opposed brush assemblies 20 are secured to the baffles 16. The brush assemblies have a plurality of bristle clusters 21, including offsetting lead clusters 22 and trailing clusters 24. The brush clusters 21 are secured in a header 25. The brush clusters may also be in a single line and not staggered as shown. As noted particularly in FIG. 2, the header 25 has an angled mounting face 26. Alternatively, with flat faces, a separate piece in the form of an angled elongate shim may be inserted to achieve the desired angular relationship. With the separate angled mount, angles between 0° and 90° can be utilized, although most often the preferred angle is between 30° and 60°. The brush assemblies, as shown in FIG. 2, are mounted in overlapping end relationship to the baffles 16 by means of a mounting hole 28 through the header 25 and the baffle 16, and secured in place by means of a mount bolt 29. Because the mount face 26 is angled, the brush bristles, whether the lead bristles 22 or the trailing bristles 24 are angled in the direction of motion of the printed circuit board 10.

Figure 5:
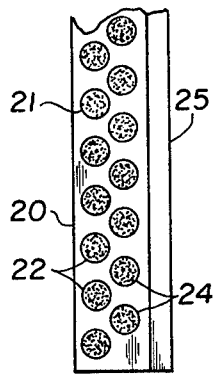
FIG. 5 is a transverse sectional view of the bristle clusters taken along section line 5—5 of FIG. 4.

To be noted in all Figures, but particularly FIG. 5 taken adjacent the header 25, the bristle clusters 21 are so offset that there is no direct passageway for any fluid to pass directly between any of the bristle clusters 21.

Figure 6:
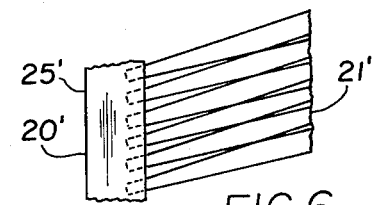
FIG. 6 is a broken front elevation of an alternative construction brush assembly in which the bristle clusters are angled upwardly.

An alternative embodiment shown with common reference numerals followed by a "'" is shown in FIG. 6 where it will be seen that the header 25' of the brush assembly 20' is substantially the same as the header just described in the first embodiment. On the other hand, the alternative embodiment bristle clusters 21 are angled upwardly so that the fluid will be assisted by gravity and draining down to the header 25 and thence back into the respective process chamber. Desirably the bristles on the brush generally range from 0.006 to 0.030 inches in diameter and are formed from polypropylene. Good results have been achieved with bristles which are approximately 0.061 inches in diameter.

In a commercial operation, the bristles on the brush generally range from 0.006 to 0.025 inches in diameter and are formed from polypropylene. The header 25 is desirably fabricated from polypropylene, but other inert materials may also be employed. In a typical installation the header is approximately three-quarters of an inch deep, and one-half inch thick and tapering to provide, over the length of the header 25, the desired angle of the mounting face 26. This angle may vary, but the range of 30° to 60° has been found most advantageous. Optionally it may be provided with a taper to achieve whatever angle is required on the mounting face 26. This angle may vary in the range of 0° to 90°, but normal installations result in a 30° to 60° angle. The brushes can be of various lengths depending upon the height of the gap to be isolated, but the bristles desirably measure approximately two and one-quarter inches from the end of the header 25 to the end of the bristles.

THE METHOD

The method of the present invention is directed to the steps of sealing a gap defined between baffles or other opposed members by positioning opposed brushes in overlapping end relationship in the gap. Desirably the brush assemblies are formed with leading and trailing bristle clusters which are in overlapping relationship to prevent the throughpassage of fluids, mist, and the like. Further, the method contemplates the overlapping portion of the opposed bristles will pass beneath the gap defined by the baffles, and they will extend upwardly to substantially the top of the gap. A further modification of the method includes angling the bristles upwardly so that the entrained fluid will, in turn, drip downwardly.

Although particular embodiments of the invention have been shown and described in full here, there is no intention to thereby limit the invention to the details of such embodiments. On the contrary, the intention is to cover all modifications, alternatives, embodiments, usages and equivalents of the subject invention as fall within the spirit and scope of the invention, specification and the appended claims.

I claim:

1. A brush seal for a gap defined by opposed baffles at the end of processing chamber comprising, in combination,
    said process chamber having means for spraying fluid on vertically disposed printed circuit boards,
    conveyor means for suspending printed circuit boards for horizontal transport through said chamber,
    a pair of opposed brush assemblies,
    each brush assembly having a rectilinear header securing a plurality of bristle clusters within the header and with the ends of the bristles exposed equidistant opposite the header,
    and elongated mounting means unitary with the header so that when the headers are secured to the baffles between a pair of chambers the brushes in opposed relationship will angle forwardly according to the path of travel of the workpiece to be cleaned.
2. In the brush seal of claim 1,
    said bristle clusters in the opposed brushes overlappingly engaging each other at their opposed end portions.
3. In the brush seal of claim 1,
    said bristles having a diameter of an order between 0.006 to 0.030 inches.
4. In the brush seal of claim 1 above,
    said bristles being formed from an inert material to the process being practiced in the processing chamber.
5. In the brush seal of claim 1 above,
    each bristle cluster assembly including lead bristle clusters and trailing bristle clusters in offset relationship.
6. In the brush seal of claim 4 above,
    said header being formed of a material inert to the process.
7. In the brush seal of claim 1,
    said header having a tapered face angling to thereby insure a forward positioning of the bristle clusters when the headers are secured to the baffle.
8. In the brush seal of claim 1,
    said mounting means providing an angle in the range of 30° to 60°.
9. In the brush seal of claim 1,
    said seal assembly being positioned at the end of the process chamber which then leads to ambient environment as the workpiece is travelled along a conveyor.
10. In the brush seal of claim 1,
    said seal assembly being positioned between two adjacent process chambers.
11. The method of sealing a process chamber having a gap at one end comprising the steps of,
    providing a gap between two opposed baffles at the end of a process chamber,
    positioning a pair of opposed elongate rectilinear brushes having opposed exposed bristle ends along adjacent sides of the baffle so that their end portions overlap,
    proportioning the brush assemblies for a sufficient length so that they ovelap the lower end of the gap defined between the opposed baffles.
12. In the method of claim 11 above,
    positioning the bristle clusters on the brushes at an angle upwardly so that fluid entrained by the bristles will have a gravitational inspired movement down the bristles towards the headers.
13. A brush seal for a gap defined at one end of a process chamber comprising, in combination,
    a pair of opposed elongate rectilinear brush assemblies,
    each brush assembly having a plurality of bristles mounted in clusters in a header with the ends of the bristles exposed and equidistant from the header,
    said headers being secured to the edges of the gap at the end of the process chamber,
    and mounting means for the headers of said brush assemblies positioned to insure and ovelapping relationship between the bristles of the opposed brush assemblies at a central portion through which a workpiece and be brushingly and sealingly passed.
14. In the brush seal of claim 13 above,
    means for mounting the header of the opposed brush assemblies so that the bristles will angle forwardly along the direction of travel of the workpiece passing through the central portion of the opposed brush assemblies where the bristles overlap.
15. In the brush seal of claim 13 above,
    said bristles being formed of a process inert material with a diameter in the range from 0.006 inches to 0.30 inches.
16. In the brush assembly of claim 13,
    said bristle clusters being mounted in the header in overlapping relationship alternatively to thereby preclude a direct gap between the bristle clusters where fluid and spray may migrate through the brush assembly.

* * * * *